United States Patent
Shiino et al.

(10) Patent No.: US 8,422,301 B2
(45) Date of Patent: Apr. 16, 2013

(54) NONVOLATILE SEMICONDUCTOR MEMORY DEVICE AND OPERATING METHOD THEREOF

(75) Inventors: Yasuhiro Shiino, Yokohama (JP); Eietsu Takahashi, Yokohama (JP); Yuji Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 13/169,414

(22) Filed: Jun. 27, 2011

(65) Prior Publication Data

US 2012/0069672 A1 Mar. 22, 2012

(30) Foreign Application Priority Data

Sep. 22, 2010 (JP) ................................ P2010-212828

(51) Int. Cl.
*G11C 11/34* (2006.01)
(52) U.S. Cl.
USPC ............ 365/185.19; 365/185.03; 365/185.11; 365/185.17; 365/185.18; 365/185.2; 365/185.22; 365/185.23; 365/185.24; 365/189.011
(58) Field of Classification Search ............ 365/185.03, 365/185.11, 185.17, 185.18, 185.19, 185.2, 365/185.22, 185.23, 185.24, 189.011
See application file for complete search history.

(56) References Cited

U.S. PATENT DOCUMENTS

| 7,916,545 B2 * | 3/2011 | Fujiu ........................ 365/185.19 |
| 8,174,895 B2 * | 5/2012 | Chen et al. ............... 365/185.19 |
| 8,274,831 B2 * | 9/2012 | Mokhlesi et al. ........ 365/185.18 |

FOREIGN PATENT DOCUMENTS

| JP | 11-134879 | 5/1999 |
| JP | 2007-12251 | 1/2007 |
| JP | 2003-173688 | 6/2008 |
| JP | 2009-140542 | 6/2009 |

OTHER PUBLICATIONS

U.S. Appl. No. 13/418,881, filed Mar. 13, 2012, Nawata.
Office Action issued Dec. 18, 2012 for Japanese Patent Application No. 2010-212828 filed Sep. 22, 2010 (with English translation).

* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

A nonvolatile semiconductor memory device in accordance with an embodiment includes a memory cell array. A control unit performs control of repeating a write operation, a write verify operation, and a step-up operation, the write operation being an operation to apply a write pulse voltage to a selected memory cell and an intermediate voltage to an unselected memory cell. The control unit controls the step-up operation such that, in a first period, the intermediate voltage is maintained at a constant value, and, in a second period, the intermediate voltage is raised by a certain value. The control unit controls the step-up operation such that the first period includes an operation to raise the write pulse voltage by a first step-up value, and the second period includes an operation to raise the write pulse voltage by a second step-up value smaller than the first step-up value.

18 Claims, 7 Drawing Sheets

("0" Write Operation)

FIG. 4

(Write Verify)

NONVOLATILE SEMICONDUCTOR MEMORY DEVICE AND OPERATING METHOD THEREOF

CROSS REFERENCE TO RELATED APPLICATIONS

This application is based upon and claims the benefit of priority from prior Japanese Patent Application No. 2010-212828, filed on Sep. 22, 2010, the entire contents of which are incorporated herein by reference.

BACKGROUND

1. Field

The embodiments described herein relate to an electrically rewritable nonvolatile semiconductor memory device and operating method thereof.

2. Description of the Related Art

A memory cell array in a NAND-type flash memory is configured as an arrangement of NAND cell units, each of the NAND cell units having a plurality of memory cells connected in series. Each end of a NAND cell unit is connected to, respectively, a bit line and a source line, via select gate transistors. The control gate electrodes CG of memory cells in each NAND cell unit are connected to different word lines. In each NAND cell unit, a plurality of memory cells are connected in series, sharing a source and a drain with each other. In NAND-type flash memory, these memory cells share select gate transistors, associated bit-line or source-line contacts, and so on. This may reduce the size of a unit memory cell. Furthermore, device regions for word lines, memory cells, and so on, in the NAND-type flash memory are configured close to a simple stripe pattern. This is suitable for shrinking and allows large capacity flash memory to be realized.

In NAND-type flash memory, data write and erase are performed by causing FN tunnel current to flow through many cells at the same time. Specifically, data write is performed on a page basis, where a set of memory cells sharing one word line represents one page. After a data write operation, a verify read (write verify) operation is performed to verify whether data is accurately written to the memory cells or not. As a result of the write verify operation, if data is not written to the memory cells satisfactorily, then similar write operations and write verify operations are repeated, raising a write pulse voltage in stages (step-up).

In addition, data erase in NAND-type flash memory is performed on a block basis, where a block is defined as a set of NAND cell units sharing a word line and a select gate line. In addition, when data erase is performed on a block basis in the NAND-type flash memory, a verify read (erase verify) operation is performed to verify whether a memory cell is achieved an erase state or not, that is, whether a threshold voltage of the memory cell falls within a certain range or not. As a result of the erase verify operation, if erase is not performed satisfactorily, then similar erase operations and erase verify operations are repeated, raising an erase voltage in stages (step-up).

Incidentally, when the write operation is performed on one selected memory cell stepping up the write pulse voltage, an intermediate voltage applied to unselected memory cells is also stepped up in some cases. At this case, due to effects of the intermediate voltage, an excessive charge is injected into the selected memory cell. In case an excessive charge is injected into the selected memory cell, the threshold voltage changes more than a desired value, with the result that data cannot be accurately written in the NAND-type flash memory. The intermediate voltage that moderate, as much as possible, effects on the selected memory cell is applied to the unselected memory cells.

DETAILED DESCRIPTION

A nonvolatile semiconductor memory device in accordance with an embodiment comprises: a memory cell array having electrically rewritable nonvolatile memory cells arranged therein; and a control unit. The control unit performs control of repeating a write operation, a write verify operation, and a step-up operation, the write operation being an operation to apply a write pulse voltage to a selected one of the memory cells for data-write and to apply an intermediate voltage having a voltage value smaller than the write pulse voltage to at least an unselected one of the memory cells adjacent to the selected one of the memory cells, the write verify operation being an operation to verify whether data-write is completed or not, and the step-up operation being an operation to raise the write pulse voltage by a certain step-up value if data-write is not completed. The control unit controls the step-up operation such that, in a first period when the number of times of applications of the write pulse voltage is less than a first number, the intermediate voltage is maintained at a constant value, and, in a second period when the number of times of applications of the write pulse voltage is not less than the first number, the intermediate voltage is raised by a certain step-up value. In addition, the control unit controls the step-up operation such that the first period includes an operation to raise the write pulse voltage by a first step-up value, and the second period includes an operation to raise the write pulse voltage by a second step-up value, the second step-up value being smaller than the first step-up value.

Next, embodiments of the present invention are described in detail with reference to the drawings.

First Embodiment

Figure 1:
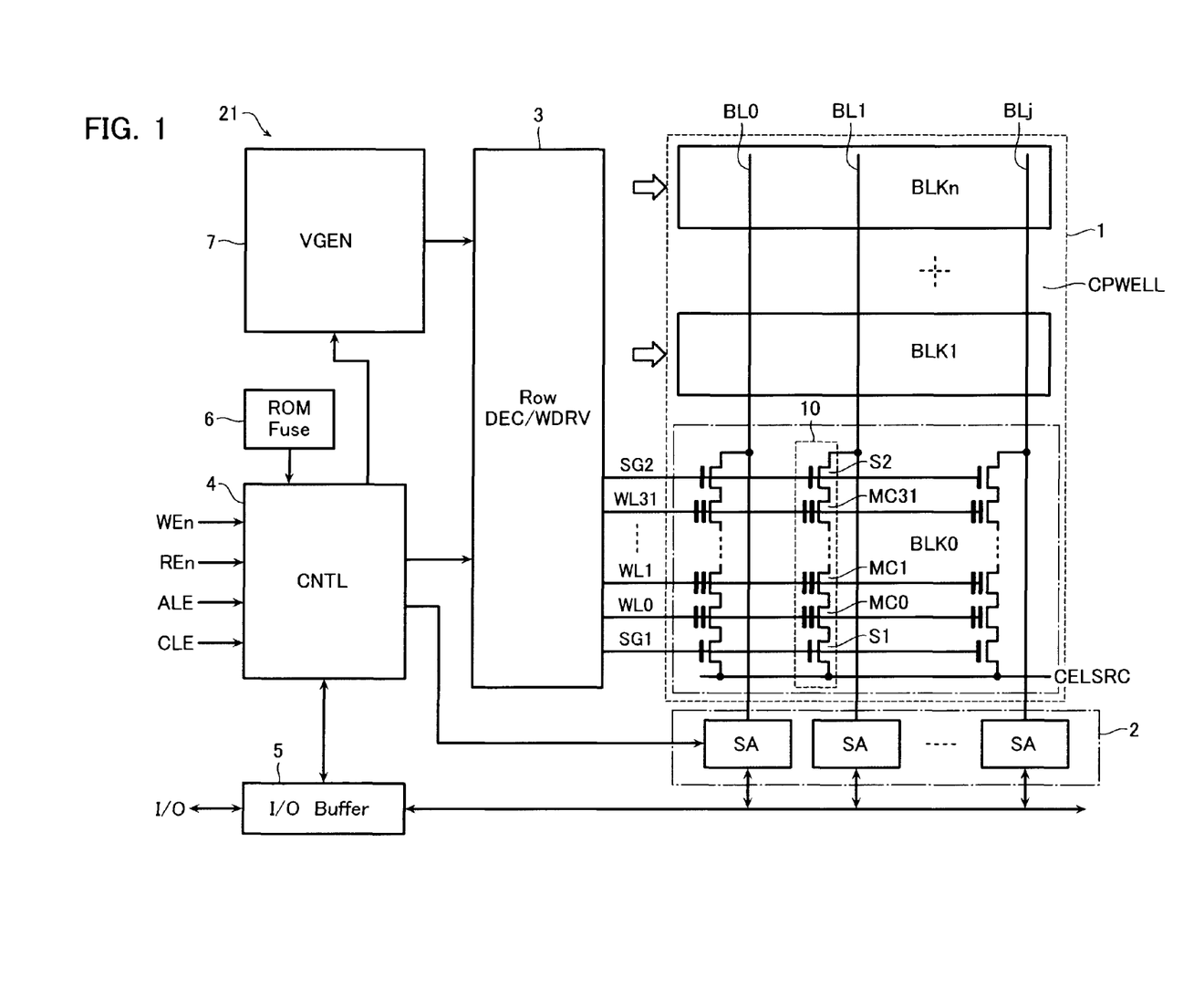
FIG. 1 is a view showing a schematic configuration of a nonvolatile semiconductor memory device in accordance with a first embodiment of the present invention.

FIG. 1 is a view showing a schematic configuration of a nonvolatile semiconductor memory device in accordance with a first embodiment of the present invention. As shown in FIG. 1, a NAND-type flash memory 21 includes a memory cell array 1, a sense amplifier circuit 2, a row decoder 3, a controller 4, an input/output buffer 5, a ROM fuse 6, and a voltage generating circuit 7. The controller 4 configures a control unit for the memory cell array 1.

The memory cell array 1 has NAND cell units 10 arranged in a matrix. One NAND cell unit 10 is configured by a plurality of memory cells MC (MC0, MC1, ..., MC31) connected in series and select gate transistors S1 and S2 connected to each end thereof. Although not shown, one memory cell MC may have a stacked gate-type structure, which is well-known in the art. That is, the memory cell MC may include: a floating gate electrode which acts as a charge storage layer and is formed on a gate insulating film (tunnel insulating film) formed between the drain and the source of the memory cell MC; and a control gate electrode which is formed on the floating gate electrode via an intergate insulating film. The memory cells MC in each NAND cell unit 10 have their control gate electrodes connected to different word lines WL (WL0, WL1, ..., WL31), respectively.

The select gate transistors S1 have their sources connected to a common source line CELSRC, and the select gate transistors S2 have their drains connected to bit lines BL. The select gate transistors S1 and S2 have their gate electrodes connected to, respectively, select gate lines SG1 and SG2 parallel to the word lines WL. A set of memory cells MC sharing one word line WL configures one page. When the memory cells MC store multilevel data or when control is performed to alternately select either even-numbered or odd-numbered bit lines, a set of memory cells MC sharing one word line WL configures multiple pages of two pages or more.

As shown in FIG. 1, a set of multiple NAND cell units 10 sharing word lines WL and select gate lines SG1 and SG2 configures a block BLK which is a unit of data erase. The memory cell array 1 has a plurality of blocks BLK (BLK0, BLK1, ..., BLKn) in a bit line BL direction. The memory cell array 1 including these multiple blocks is formed in one cell well (CPWELL) of a silicon substrate.

The bit lines BL of the memory cell array 1 are connected to the sense amplifier circuit 2 that includes a plurality of sense amplifiers SA. The sense amplifiers SA configure a page buffer for sensing read data and retaining write data. The sense amplifier circuit 2 includes column select gates. The row decoder (including a word-line driver WDRV) 3 selects and drives the word lines WL and select gate lines SG1 and SG2.

The data input/output buffer 5 transmits and receives data between the sense amplifier circuit 2 and an external input/output terminal, and receives other data such as command data or address data. The controller 4 controls the entire memory operation in response to external control signals, such as write enable signals WEn, read enable signals REn, address latch enable signals ALE, or command latch enable signals CLE.

Specifically, the controller 4 includes a command interface as well as address latch and transfer circuits, and determines whether supplied data is write data or address data. Depending on the results of this determination, write data is transferred to the sense amplifier circuit 2, or address data is transferred to the row decoder 3, the sense amplifier circuit 2, and so on. The controller 4 also performs sequence control of read, write, or erase operations, control of applied voltage, and so on, based on external control signals.

The voltage generating circuit 7 generates a pulse voltage based on control signals from the controller 4. The voltage generating circuit 7 generates various voltages used for the write, erase, and read operations.

Figure 2:
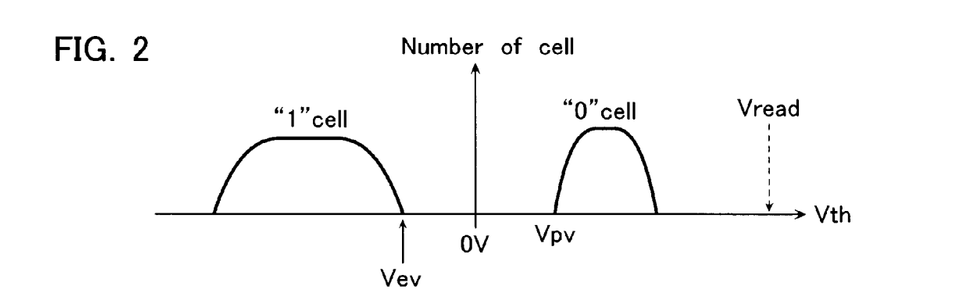
FIG. 2 is a view showing a relationship between data to be stored in a memory cell and threshold voltage.

FIG. 2 is a view showing a relationship between data to be stored in a memory cell MC and threshold voltage. When binary data is stored in one memory cell MC, a memory cell MC with a negative threshold voltage is defined as a "1" cell that retains logical "1" data, and a memory cell MC with a positive threshold voltage is defined as a "0" cell that retains logical "0" data. An operation setting a memory cell MC to a "1" data state is assumed to be an erase operation, and an operation setting a memory cell MC to a "0" data state is assumed to be a write operation.

[Erase Operation]

In NAND-type flash memory, a data erase operation is normally performed on a block basis. In the data erase operation, an erase pulse voltage Vera (of the order of 10 V to 30 V) is applied to the cell well (CPWELL), and 0 V is applied to all of the word lines WL in a selected block. As a result, charge is extracted from the floating gate electrodes of respective memory cells MC to the cell well by FN tunnel current, thereby reducing the threshold voltages of the memory cells MC. At this time, the select gate lines SG1 and SG2 are set to floating states to avoid breakdown of the gate oxide films of the select gate transistors S1 and S2.

The bit line BL and the source line CELSRC are also set to floating states. Note that the erase operation is executed again according to the results of an erase verify operation performed after the erase operation. When the erase operation is re-performed, the erase pulse voltage Vera is stepped up in increments of a voltage $\Delta V$, and the erase operation executed using the stepped-up voltage Vera+$\Delta V$.

[Write Operation]

Figure 3:
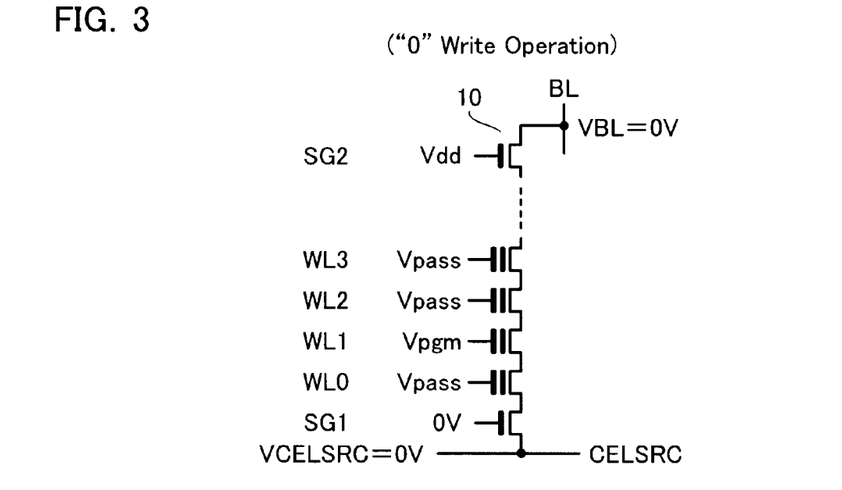
FIG. 3 is a view explaining voltages applied to a NAND cell unit during a write operation.

FIG. 3 is a view explaining voltages applied to a NAND cell unit during a write operation. The write operation is executed on a page basis. During the write operation, a write pulse voltage Vpgm (about 10 V to 25 V) is applied to a selected word line (WL1) in a selected block. In addition, a write intermediate voltage Vpass (about 5 V to 15 V) is applied to unselected word lines (WL0, WL2, WL3, ...), and a voltage Vdd is applied to the select gate line SG2.

Prior to this write operation, the bit line BL and the NAND cell unit 10 are precharged according to the write data. Specifically, when writing "0" data, 0 V is applied to the bit line BL from the sense amplifier circuit 2. This voltage of the bit line is transferred to the channel of the memory cell MC connected to the selected word line WL1, via the select gate transistor S2 and unselected memory cells MC. Accordingly, under the above-mentioned write operation conditions, charge is injected into the floating gate electrode from the channel of the selected memory cell MC, and the threshold voltage of the memory cell MC shifts to positive (which provides a "0" cell).

When writing "1" (i.e., in the case that "0" data is not written to the selected memory cell MC; write inhibit), the voltage Vdd is applied to the bit line BL. This voltage Vdd of the bit line is reduced by an amount of the threshold voltage of the select gate transistor S2 and transferred to the channel of the NAND cell unit, and then the channel is set to a floating state. Thus, when the above-mentioned write pulse voltage Vpgm or intermediate voltage Vpass is applied, the channel voltage rises due to capacitance coupling, with the result that charge is not injected into the floating gate electrode. Accordingly, the memory cell MC retains "1" data.

Similarly to the erase operation, the write operation is executed again according to the results of a write verify operation to be described later. When the write operation is re-performed, the write pulse voltage Vpgm is stepped up in increments of a voltage $\Delta V$, and the write operation executed using the stepped-up voltage Vpgm+$\Delta V$. Now, the initially applied write pulse voltage is a voltage Vpgm0. Note that, as described in detail later, a value of the step-up value $\Delta V$ may be configured variable.

[Read Operation]

In data read, a read voltage 0 V is applied to a word line WL (selected word line WL1) to which a selected memory cell MC in the NAND cell unit 10 is connected. In addition, a read pass voltage Vread (of the order of about 3 V to 8 V) is applied to the word lines WL (unselected word lines WL0, WL2, WL3, . . . ) to which unselected memory cells MC are connected. At this time, the sense amplifier circuit 2 detects whether current flows through the NAND cell unit 10 or not, to determine what data is stored therein.

[Write Verify Operation]

During data read, a margin is required between a set threshold voltage state and the read voltage 0 V for ensuring data reliability. Therefore, in the data erase and write operations, it becomes necessary for a lower limit value Vpv of the threshold voltage distribution of "0" data and an upper limit value Vev of the threshold voltage distribution of "1" data to be controlled to have an appropriate margin with the voltage 0 V (refer to FIG. 2).

Thus, after the write pulse voltage Vpgm is applied in the previously-mentioned write operation, a verify read (write verify) operation is performed to verify that the threshold voltage of the selected memory cell MC is not less than the lower limit value Vpv. In the case of the erase operation, after an erase pulse voltage is applied by the operation as mentioned above, a verify read (erase verify) operation is performed to verify that the threshold voltage of the erase memory cell is not more than the upper limit value Vev of the threshold voltage distribution.

Figure 4:
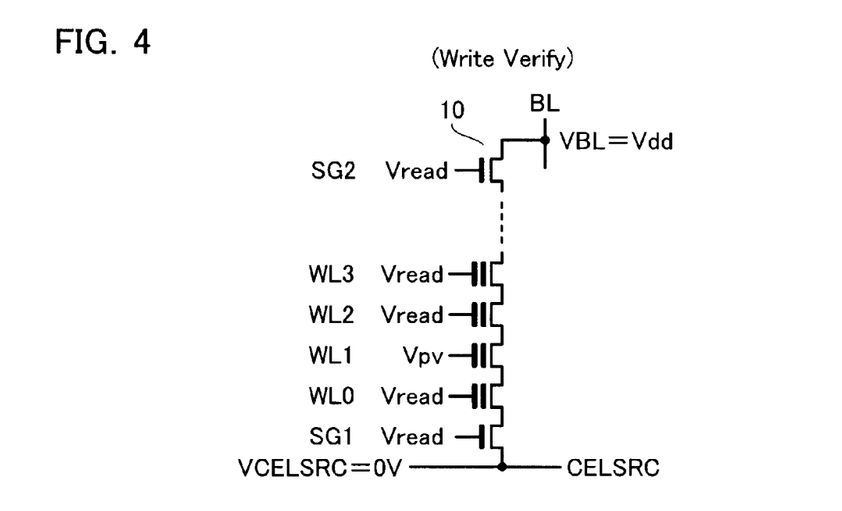
FIG. 4 is a view explaining voltages applied to a NAND cell unit during a write verify operation.

FIG. 4 is a view explaining voltages applied to the NAND cell unit 10 during a write verify operation. The write verify operation is substantially similar to the above-mentioned read operation. That is, the read pass voltage Vread (of the order of about 3 V to 8 V) is applied to the word lines WL (unselected word lines WL0, WL2, WL3, . . . ) to which unselected memory cells MC are connected and to the select gate lines SG1 and SG2. In addition, the voltage Vdd is applied to the bit line BL, and 0 V is applied to the common source line CELSRC. Now, a write verify voltage Vpv is applied to the word line WL (selected word line WL1) to which the selected memory cell MC is connected. At this time, the sense amplifier circuit 2 detects whether current flows through the NAND cell unit 10 or not, to determine what data is stored therein.

If the selected memory cell MC has data "0" state written thereto, current does not flow in the NAND cell unit 10, even if the above-mentioned write verify operation is performed. On the other hand, when the threshold voltage of the selected memory cell MC does not reach the data "0" state distribution, current flows in the NAND cell unit 10. If it is detected that the selected memory cell MC has data "0" state written thereto, then it is considered that the selected memory cell MC is sufficiently written, in which case the write operation terminates. If the selected memory cell MC does not have data "0" state written thereto, then the write operation is performed again on the selected memory cell MC.

[Step-Up Operation]

Figure 5:
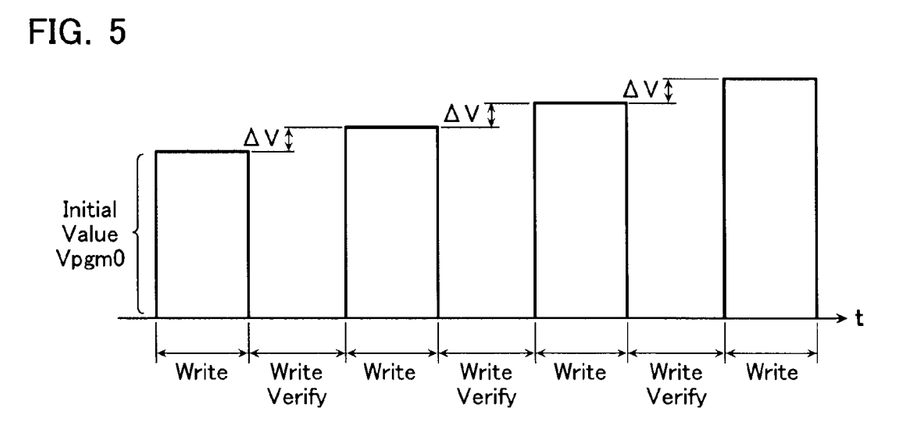
FIG. 5 is a view showing how a write pulse voltage Vpgm is stepped up when a write operation is re-performed after a write verify operation.

FIG. 5 is a view showing how the write pulse voltage Vpgm is stepped up when the write operation is re-performed after the write verify operation. When the write operation is performed again, the write pulse voltage Vpgm is set to a voltage (Vpgm0+$\Delta V$) which is larger than an initial value Vpgm0 by a step-up value $\Delta V$ (>0) (refer to FIG. 5). If there still remains any memory cell MC that is not sufficiently written even by the re-set large write pulse voltage Vpgm=Vpgm0+$\Delta V$, then a further step-up operation is performed to increase the write pulse voltage by a step-up value $\Delta V$ (set Vpgm=Vpgm0+2$\Delta V$). The write, write verify, and step-up operations are then repeated until the data write is completed. The write pulse voltage Vpgm steps up by $\Delta V$ for each repetition. Note that the step-up width may be of any value that makes the write pulse voltage Vpgm larger than the previous write pulse voltage, and is not limited to equal values of $\Delta V$. In the embodiments below, control of this step-up value $\Delta V$ is described.

[Control of Step-Up Value of Write Pulse Voltage]

Figure 6:
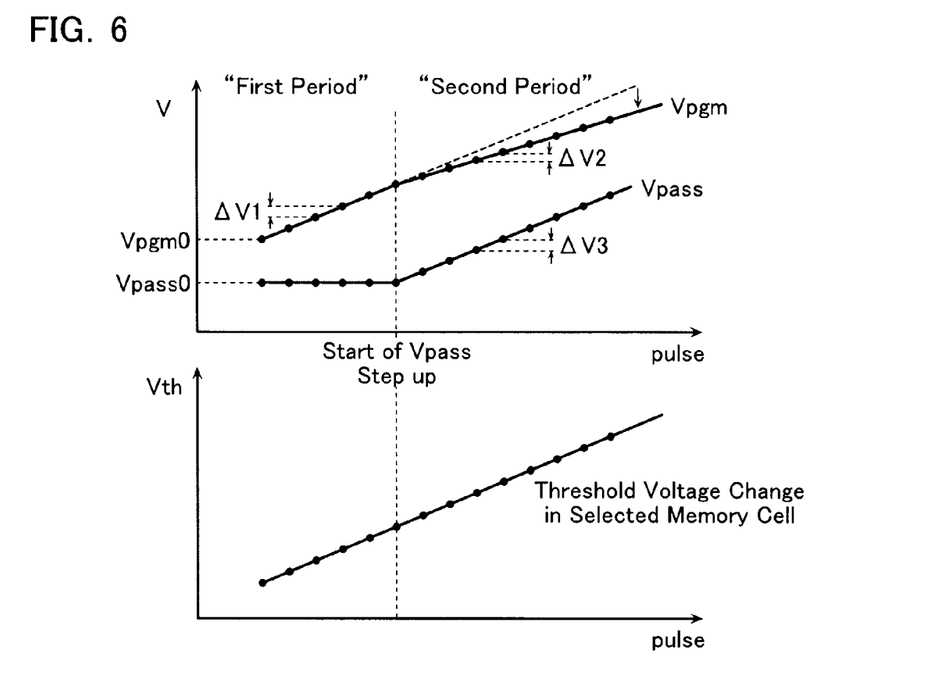
FIG. 6 shows graphs explaining how a step-up value ΔV of the write pulse voltage Vpgm is changed.

As mentioned above, the write pulse voltage Vpgm is stepped up by a voltage $\Delta V$ according to the results of the write verify operation. Now, the value of the step-up value $\Delta V$ of the write pulse voltage Vpgm can be controlled as below. FIG. 6 shows graphs explaining how the step-up value $\Delta V$ of the write pulse voltage Vpgm is changed. Shown arranged one above the other in FIG. 6 are a graph representing write pulse voltage Vpgm and intermediate voltage Vpass during the write operation, and a graph representing change in the threshold voltage of the selected memory cell MC during the write operation. The horizontal axis in FIG. 6 represents the number of times of pulse applications during the write operation.

As shown in FIG. 6, first, the write pulse voltage Vpgm is set to the voltage Vpgm0, thereby starting the write operation. Now, the dot portions on the graph represent applications of the write pulse voltage Vpgm and the intermediate voltage Vpass. Write verify operations are executed between the dots. In a period (first period) before the number of times of pulse applications reaches a certain number, the write pulse voltage Vpgm rises by a step-up value $\Delta V1$ (first step-up value). In this first period, the value of the intermediate voltage Vpass is maintained, as is, at a constant voltage value Vpass0.

In a period (second period) after the number of times of applications of the write pulse voltage Vpgm reaches the certain number of times (first number of times), the write pulse voltage Vpgm rises by a step-up value $\Delta V2$ (second step-up value). The step-up value $\Delta V2$ herein has a value smaller than that of the step-up value $\Delta V1$. Now, in an entirety of the first period, the step-up value $\Delta V1$ is fixed at a constant value, and in an entirety of the second period, the step-up value $\Delta V2$ is fixed at a constant value.

When the step-up operation of the write pulse voltage Vpgm is repeated, the potential difference between the control gate electrode and the channel in a write prohibit memory cell MC connected to the selected word line WL increases, with the result that data is erroneously written to the write prohibit memory cell MC. Accordingly, to prevent erroneous write of data to a write prohibit memory cell MC, the intermediate voltage Vpass is stepped up to raise the channel potential of the write prohibit memory cell MC. In the second period shown in FIG. 6, the nonvolatile semiconductor memory device of the present embodiment has the intermediate voltage Vpass raised by a step-up value ΔV3.

The voltage value of the write pulse voltage Vpgm or intermediate voltage Vpass can be controlled by the voltage generating circuit 7. For example, changing the number of boost circuits in the voltage generating circuit 7 allows the voltage of the write pulse voltage Vpgm or intermediate voltage Vpass to be controlled.

In the nonvolatile semiconductor memory device of the present embodiment, reducing the value of the step-up value ΔV2 of the write pulse voltage Vpgm in the second period allows effects caused by the intermediate voltage Vpass to be moderated, and allows data to be accurately written to the selected memory cell MC. This moderation of effects caused by the intermediate voltage Vpass is described with reference to FIGS. 7 and 8.

Figure 7:
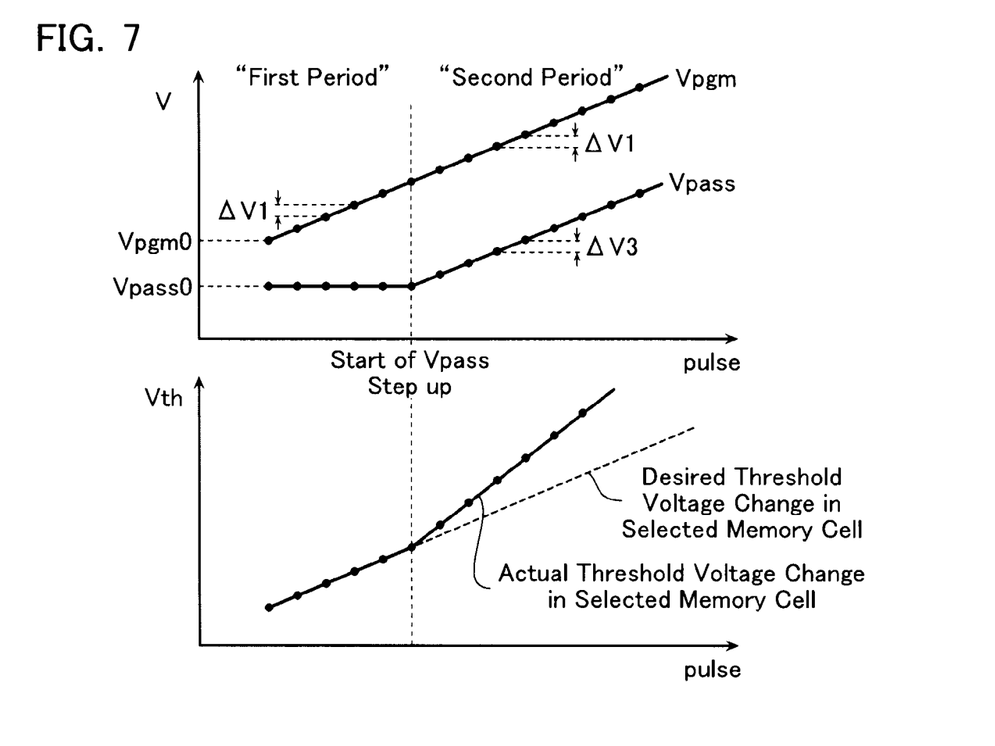
FIG. 7 shows graphs explaining operation of a nonvolatile semiconductor memory device in accordance with a comparative example.
Figure 8:
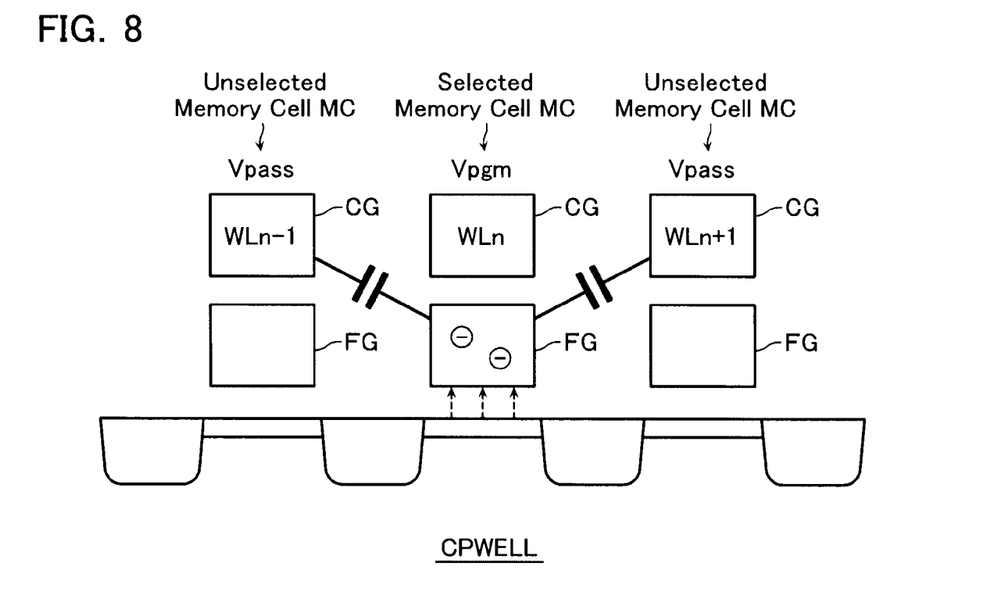
FIG. 8 is a schematic view explaining operation of the nonvolatile semiconductor memory device.

FIG. 7 shows graphs explaining a step-up operation of the write pulse voltage Vpgm in a comparative example. In addition, FIG. 8 is a schematic view showing effects on a memory cell MC due to the write pulse voltage Vpgm and the intermediate voltage Vpass applied in the write operation. FIG. 8 shows a cross-sectional view of the memory cell MC schematically. The memory cell MC includes the cell well CPWELL, and, formed on the cell well CPWELL, a floating gate electrode FG and a control gate electrode CG. The control gate electrode CG is a part of the word line WL extending in a perpendicular direction to a plane of paper.

As shown in FIG. 7, in the write operation in the comparative example, the step-up value of the write pulse voltage Vpgm is set to ΔV1 in both the first period and the second period. That is, the write pulse voltage Vpgm rises by a constant step-up value ΔV1 irrespective of whether the intermediate voltage Vpass is subject to a step-up operation or not.

As shown in FIG. 8, effects are exerted on the floating gate electrode FG of a selected memory cell MC by the intermediate voltage Vpass applied to unselected memory cells MC as well as by the write pulse voltage Vpgm applied to the selected memory cell MC. The potential of the floating gate electrode FG of the selected memory cell MC rises due to capacitance coupling not only with the selected word line WLn but also with the unselected word lines (WLn−1 and WLn+1) applied with the intermediate voltage Vpass.

Now, as shown in FIG. 7, in addition to the write pulse voltage Vpgm rising by the constant step-up value ΔV1, when the intermediate voltage Vpass starts its step-up operation in the second period, the potential of the floating gate electrode FG increases greatly. Therefore, a larger amount of charge than anticipated is injected into the floating gate electrode FG. As a result, as shown in the graph of threshold voltage change in FIG. 7, the actual threshold voltage of the selected memory cell MC changes greatly. When the threshold voltage changes by more than the desired value, data cannot be written accurately to the selected memory cell MC.

In contrast, as shown in FIG. 6, when the step-up operation is performed such that the step-up value of the write pulse voltage Vpgm is ΔV1 in the first period and LV2 in the second period, the rise in potential of the floating gate electrode FG in the second period becomes gentle. Therefore, an excessive charge is not injected into the floating gate electrode FG. As a result, as shown in the graph of threshold voltage change in FIG. 6, the amount of change in the threshold voltage of the selected memory cell MC is substantially constant in the first period and the second period. It is possible to control the threshold voltage of the selected memory cell MC, whereby data can be written accurately to the selected memory cell MC.

Note that the amount of rise in the write pulse voltage Vpgm shown in FIG. 6 is fixed at ΔV1 for the entirety of the first period, and is fixed at ΔV2 for the entirety of the second period. This amount of rise in the write pulse voltage Vpgm can be controlled by the controller 4. For example, the value of ΔV1 in the step-up operation of the first period may be changed to values that differ from each other, and the value of ΔV2 in the step-up operation of the second period may be changed to values that differ from each other. If control is performed such that the step-up value ΔV2 of the second period is smaller than the step-up value ΔV1 of the first period, then the values of the step-up values ΔV1 and ΔV2 may be set to different values. Provided the step-up operation of the write pulse voltage Vpgm fulfils ΔV2<ΔV1, then erroneous write to the selected memory cell MC can be prevented.

Figure 9:
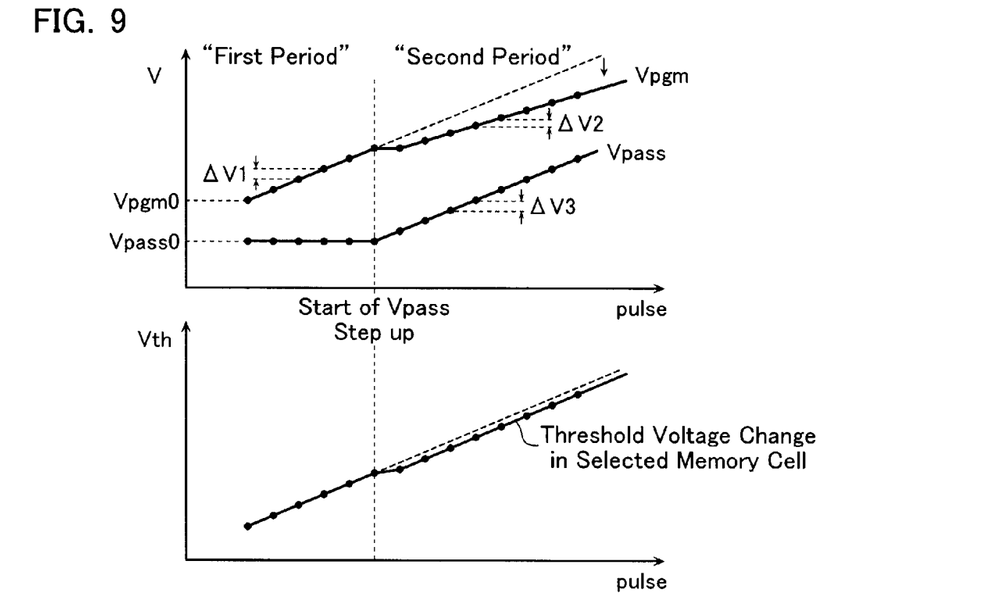
FIG. 9 shows graphs explaining another example of operation of the nonvolatile semiconductor memory device in accordance with the first embodiment of the present invention.

FIG. 9 shows graphs explaining how the value of the step-up value of the write pulse voltage Vpgm in the second period is changed. In the example shown in FIG. 9, after the step-up of the intermediate voltage Vpass is started in the second period, a first time step-up operation of the write pulse voltage Vpgm is not performed. That is, the step-up value of the write pulse voltage Vpgm is set to 0. Subsequently, the write pulse voltage Vpgm rises by the step-up value ΔV2. In the example shown in FIG. 9, the step-up value in the second period changes.

When the second period is entered and the step-up operation of the intermediate voltage Vpass is started, the threshold voltage of the selected memory cell MC changes rapidly due to effects caused by the intermediate voltage Vpass. However, by not performing the first time step-up operation of the write pulse voltage Vpgm in the second period, change in the threshold voltage of the selected memory cell MC can be suppressed and erroneous write prevented.

In addition, various parameters, such as the step-up value of the write pulse voltage Vpgm or intermediate voltage Vpass, or the step-up start time of the intermediate voltage Vpass, can be controlled appropriately by the controller 4. As an example, the controller 4 determines how degraded a state a memory cell MC is in, based on the number of times of pulse applications during the erase operation, the number of times of write/erase operations to the NAND-type flash memory, the number of times of pulse applications during the write operation, and so on. The results of this determination may be stored in the ROM fuse 6 shown in FIG. 1, for example. On the basis of this information, the controller 4 can also change the likes of the step-up value of the write pulse voltage Vpgm or intermediate voltage Vpass, or the step-up start time of the intermediate voltage Vpass.

Second Embodiment

Next, a second embodiment of the present invention is described with reference to FIGS. 10 and 11. The nonvolatile semiconductor memory device in the second embodiment has a configuration similar to that in the above-described first embodiment shown in FIG. 1. However, the nonvolatile semiconductor memory device of the second embodiment, in a period (third period) after the number of times of applications of the write pulse voltage Vpgm reaches a second number of times (first number of times<second number of times), does not execute the step-up operation of the intermediate voltage Vpass. When the step-up operation of the intermediate voltage Vpass is repeated, the potential difference between the control gate electrode CG and the channel in an unselected memory cell MC connected to an unselected word line WL increases, leading to data being erroneously written to the unselected memory cell MC. Accordingly, the step-up operation of the intermediate voltage Vpass is terminated to prevent erroneous write of data to the unselected memory cell MC. The nonvolatile semiconductor memory device in the present embodiment maintains the intermediate voltage Vpass at a constant voltage value in the third period.

Figure 10:
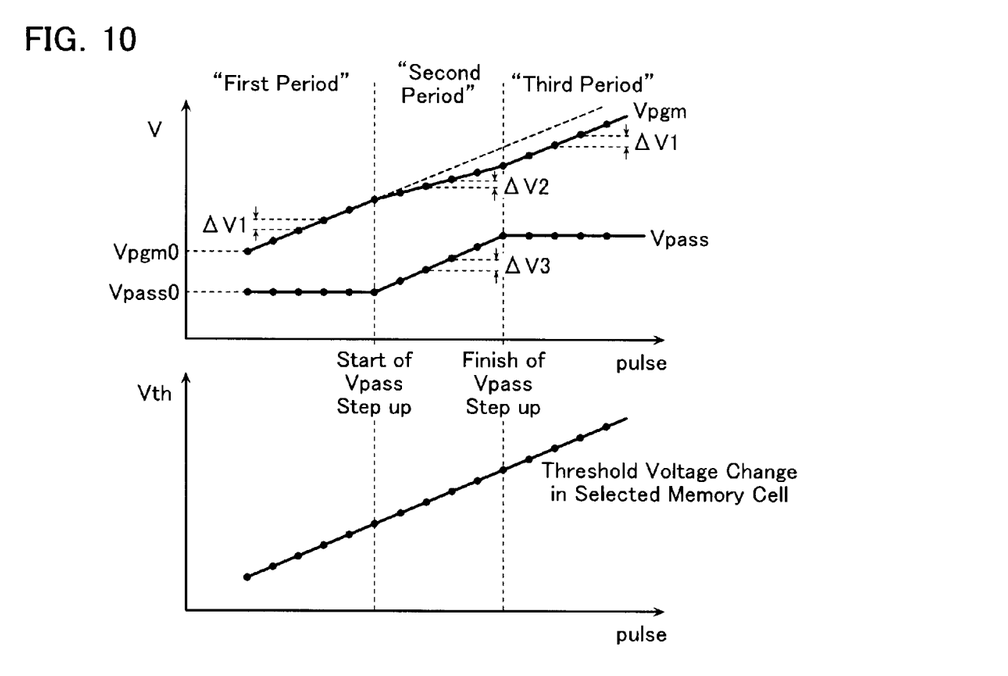
FIG. 10 shows graphs explaining operation of a nonvolatile semiconductor memory device in accordance with a second embodiment of the present invention.
Figure 11:
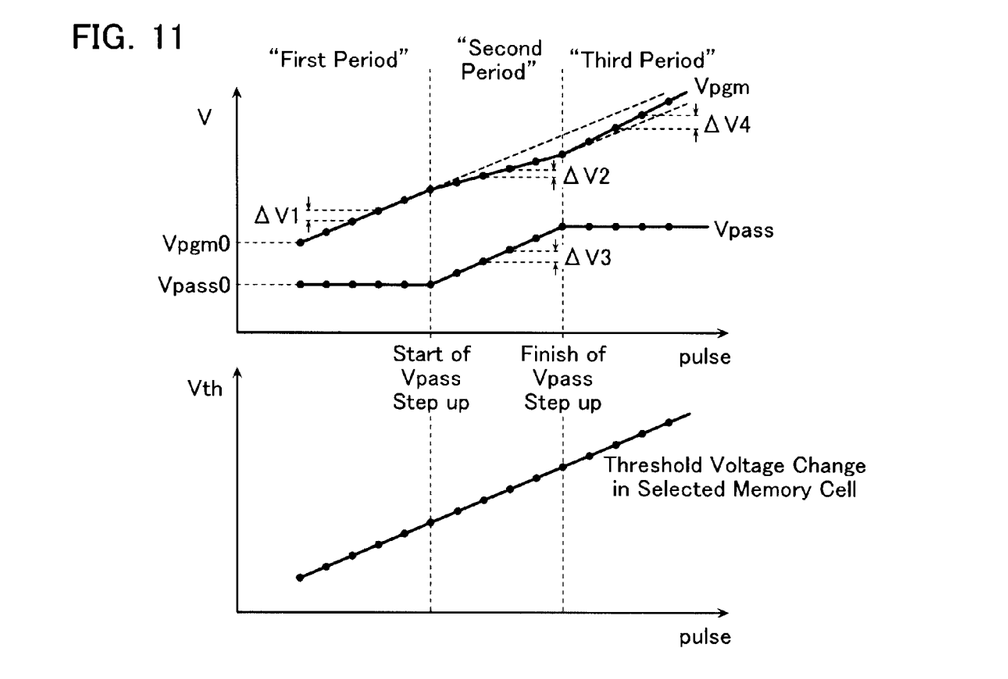
FIG. 11 shows graphs explaining another example of operation of the nonvolatile semiconductor memory device in accordance with the second embodiment of the present invention.

As shown in FIG. 10, in the third period, the write pulse voltage Vpgm rises by the step-up value $\Delta V1$. Now, the step-up value $\Delta V1$ in the first period and the third period may be set to an identical value. Moreover, the step-up value $\Delta V1$ is fixed at a constant value in the entirety of the first period and the third period.

Moreover, the step-up value of the write pulse voltage Vpgm in the third period may be different to the step-up value $\Delta V1$ of the first period. As shown in FIG. 11, a step-value $\Delta V4$ of the write pulse voltage Vpgm in the third period may also be set, such that the step-values satisfy $\Delta V2 < \Delta V1 < \Delta V4$.

In the third period, the intermediate voltage Vpass is a constant value. Hence, if the write pulse voltage Vpgm continues to be stepped up by the step-up value $\Delta V2$, the potential of the floating gate electrode FG in the selected memory cell MC does not rise sufficiently, with the result that an injected amount of charge is reduced. However, in the nonvolatile semiconductor memory device of the present embodiment, the step-up value of the write pulse voltage Vpgm in the third period is set to $\Delta V1$ or $\Delta V4$. Therefore, the potential of the floating gate electrode FG in the third period is sufficiently raised, enabling the required charge to be injected into the floating gate electrode FG. As a result, as shown in the graphs of threshold voltage change in FIGS. 10 and 11, the amount of change in the threshold voltage of the selected memory cell MC is substantially constant for the first period, second period, and third period. This enables data to be accurately written to the selected memory cell MC.

Third Embodiment

Figure 12:
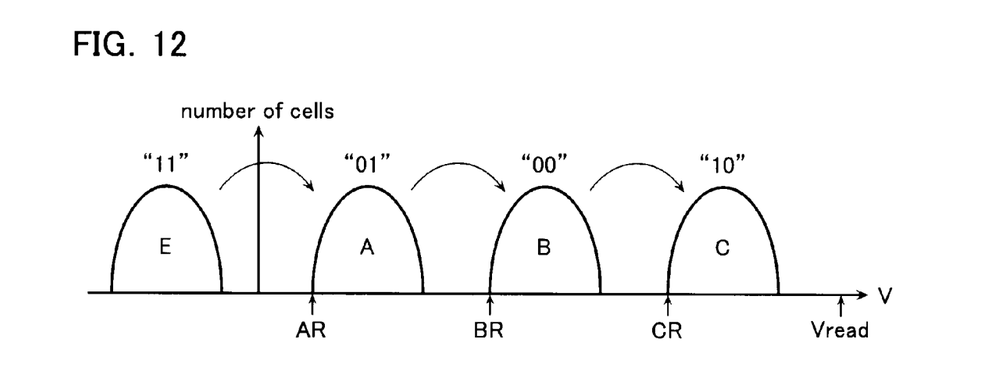
FIG. 12 is a view showing a relationship between data to be stored in a memory cell and threshold voltage.
Figure 13:
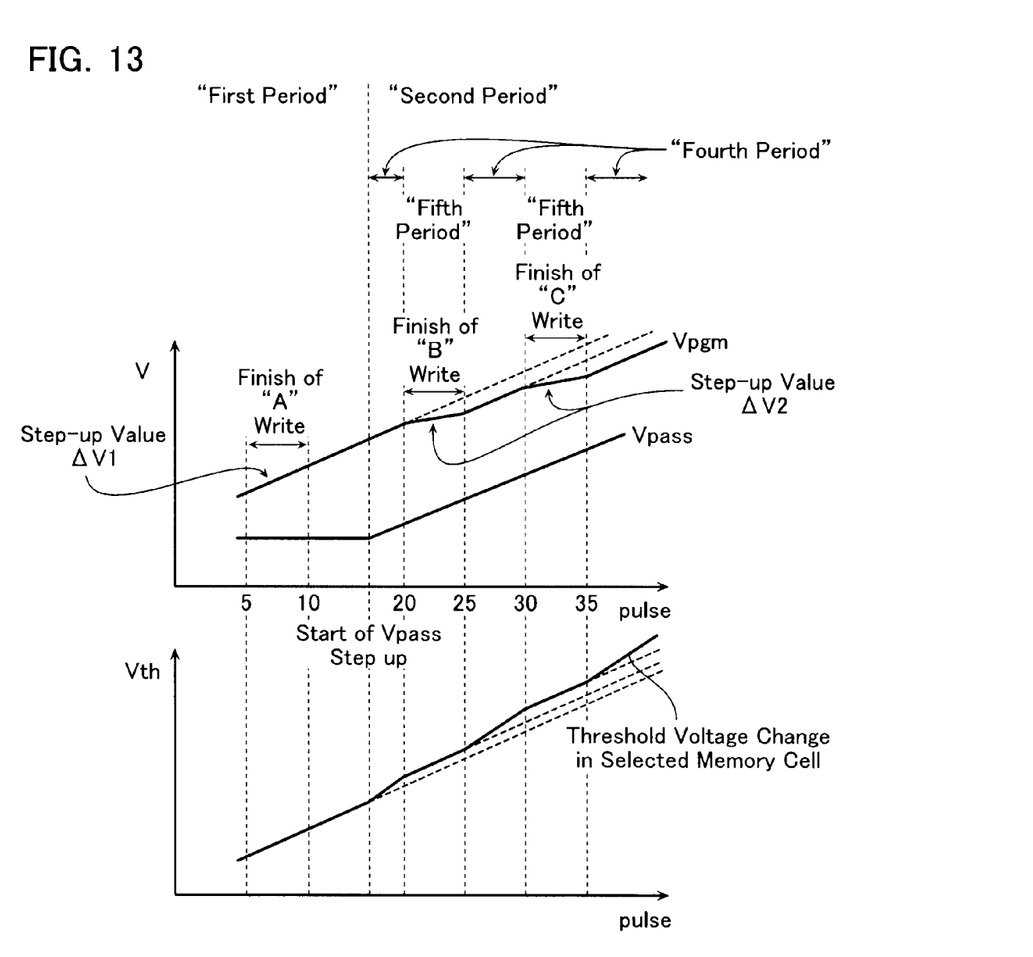
FIG. 13 shows graphs explaining operation of a nonvolatile semiconductor memory device in accordance with a third embodiment of the present invention.

Next, a third embodiment of the present invention is described with reference to FIGS. 12 and 13. The nonvolatile semiconductor memory device in the third embodiment has a configuration similar to that in the above-described first embodiment shown in FIG. 1. In the above-described embodiment, the case is described of a nonvolatile semiconductor memory device having memory cells configured to store binary data. The nonvolatile semiconductor memory device herein may also have memory cells MC configured to store four-value data (two bits per cell). In this case, threshold voltage distributions of data are as in FIG. 12. As shown in FIG. 12, four kinds of threshold voltage distributions (E, A, B, and C) are provided, in order from a lowest threshold voltage. Four kinds of data, namely "11", "01", "00", and "10", are allocated to these threshold voltage distributions. Now, the threshold voltage distribution E is a negative threshold voltage state obtained by block basis erase. Voltages for determining whether data is written to the selected memory cell MC or not in the write verify operation are the respective lower limit values AR, BR, and CR of the threshold voltage distributions A, B, and C.

When the write pulse voltage is stepped up in the write operation on the selected memory cell MC, distribution A is first to have write completed, followed in order thereafter by distribution B and distribution C. Now, each of the memory cells MC formed in the memory cell array 1 is manufactured by an identical process, and operating characteristics of the memory cells MC are also substantially equal. It is therefore also possible to anticipate beforehand how many times of write pulse voltage Vpgm applications it will take to cause data write to be completed. In the graph of FIG. 13, a range of between five and ten times of write pulse voltage applications is assumed to be an expected timing for write of distribution A to be completed. Similarly, a range of between 20 and 25 times of write pulse voltage applications is assumed to be an expected timing for write of distribution B to be completed, and a range of between 30 and 35 times of write pulse voltage applications is assumed to be an expected timing for write of distribution C to be completed.

In the present embodiment, in the second period when the intermediate voltage Vpass is stepped up, the step-up operation of the write pulse voltage Vpgm is performed using both the step-up values $\Delta V1$ and $\Delta V2$. At the expected timings for write of distribution B or distribution C to be completed in the second period (a fifth period in the second period), the write pulse voltage Vpgm rises by the step-up value $\Delta V2$. On the other hand, even in the second period, at other than the expected timings for write of distribution B or distribution C to be completed (a fourth period in the second period), the write pulse voltage Vpgm rises by the step-up value $\Delta V1$.

In the second period, when the write pulse voltage Vpgm rises by the step-up value $\Delta V1$ during stepping-up of the intermediate voltage Vpass, the potential of the floating gate electrode FG in the selected memory cell MC increases greatly. As a result, much charge is injected into the floating gate electrode FG, thereby causing a large change in the threshold voltage of the selected memory cell MC. However, at other than the expected timings for write of distribution B or distribution C to be completed (the fourth period), even if the threshold voltage of the selected memory cell MC changes greatly, it is difficult for erroneous data being written to the selected memory cell MC to occur. Hence, the write pulse voltage Vpgm can be raised by the step-up value $\Delta V1$.

Moreover, when it is difficult for erroneous data being written to occur, it is preferable for much charge to be injected into the floating gate electrode FG by one write pulse voltage Vpgm application. This is because a large change in the threshold voltage of the selected memory cell MC allows the write operation to be completed more quickly. In the present embodiment, the threshold voltage of the selected memory cell MC can be changed greatly at other than the expected timings for write of distribution B or distribution C to be completed (the fourth period). Hence, the present embodiment contributes also to speeding-up of the write operation.

On the other hand, at the expected timings for write of distribution B or distribution C to be completed (the fifth period), the write pulse voltage Vpgm is raised by the step-up value $\Delta V2$. Hence, the rise in potential difference of the floating gate electrode FG in the selected memory cell MC can be suppressed and the injected amount of charge reduced. As a result, as shown in the graph of threshold voltage change in FIG. 13, the amount of change in the threshold voltage of the selected memory cell MC has a small value only at the expected timings for write of distribution B or distribution C to be completed in the second period. This enables the threshold voltage of the selected memory cell MC to be controlled to achieve a desired value, and data to be accurately written to the selected memory cell MC.

Other

This concludes description of the embodiments of the present invention, but it should be noted that the present invention is not limited to the above-described embodiments, and that various alterations, additions, combinations, and so on, are possible within a range not departing from the scope and spirit of the invention. For example, in the above-described third embodiment, depending on how many times the write pulse voltage is expected to be applied for completing write of distribution B or distribution C, the expected timing may be changed.

When a large number of write operations or erase operations are executed, the memory cells MC are degraded, and it becomes easier for charge to be injected into the floating gate electrode FG (the write operation becomes faster). If expected timings for write of distribution B or distribution C to be completed are fixed, there is a risk of erroneous data being written when the write pulse voltage Vpgm is being raised by step-up value ΔV1. To counter this, the controller 4 may determine how degraded a state a memory cell MC is in, based on the number of times of pulse applications during the erase operation, the number of times of write/erase operations, the number of times of pulse applications during the write operation, and so on, and may change the expected timings for write of distribution B or distribution C to be completed. In addition, in the aforementioned embodiments, the cases of binary data and four-value data being stored in the memory cells are described. However, other values of data (for example, eight-value data or other multilevel data) may also be stored in the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying aims and their equivalents are intended to cover such forms or modifications as would fall within the scope and spirit of the inventions.

What is claimed is:

1. A nonvolatile semiconductor memory device comprising:
   a memory cell array having electrically rewritable nonvolatile memory cells arranged therein; and
   a control unit configured to perform control of repeating a write operation, a write verify operation, and a step-up operation, the write operation being an operation to apply a write pulse voltage to a selected one of the memory cells for data-write and to apply an intermediate voltage having a voltage value smaller than the write pulse voltage to at least an unselected one of the memory cells adjacent to the selected one of the memory cells, the write verify operation being an operation to verify whether data-write is completed or not, and the step-up operation being an operation to raise the write pulse voltage by a certain step-up value if data-write is not completed,
   the control unit being configured to control the step-up operation such that, in a first period when the number of times of applications of the write pulse voltage is less than a first number, the intermediate voltage is maintained at a constant value, and, in a second period when the number of times of applications of the write pulse voltage is not less than the first number, the intermediate voltage is raised by a certain step-up value, and
   the control unit being configured to control the step-up operation such that the first period includes an operation to raise the write pulse voltage by a first step-up value, and the second period includes an operation to raise the write pulse voltage by a second step-up value, the second step-up value being smaller than the first step-up value.

2. The nonvolatile semiconductor memory device according to claim 1, wherein
   the control unit is configured to control the step-up operation such that the write pulse voltage is raised by the first step-up value over an entirety of the first period, and the write pulse voltage is raised by the second step-up value over an entirety of the second period.

3. The nonvolatile semiconductor memory device according to claim 1, wherein
   the control unit is configured to control the step-up operation such that the first step-up value is fixed at a constant value over an entirety of the first period, and the second step-up value is fixed at a constant value over an entirety of the second period.

4. The nonvolatile semiconductor memory device according to claim 1, wherein
   the control unit is configured to control the step-up operation such that a value of the first step-up value and the second step-up value are variable.

5. The nonvolatile semiconductor memory device according to claim 1, wherein
   the control unit is configured to control the step-up operation such that, when applying the write pulse voltage for the first time in the second period, a voltage value of the write pulse voltage is not raised.

6. The nonvolatile semiconductor memory device according to claim 1, wherein
   the control unit is configured to control the step-up operation such that, in a third period when the number of times of applications of the write pulse voltage is not less than a second number, the intermediate voltage is maintained at a constant value, the second number being larger than the first number, and
   the control unit is configured to control the step-up operation such that the third period includes an operation to raise the write pulse voltage by the first step-up value.

7. The nonvolatile semiconductor memory device according to claim 1, wherein
   the control unit is configured to control the step-up operation such that, in a third period when the number of times of applications of the write pulse voltage is not less than a second number, the intermediate voltage is maintained at a constant value, the second number being larger than the first number, and
   the control unit is configured to control the step-up operation such that the third period includes an operation to raise the write pulse voltage by a third step-up value, the third step-up value being larger than the first step-up value.

8. The nonvolatile semiconductor memory device according to claim 1, wherein
   the control unit is configured to control the step-up operation such that,
      during a fourth period included in the second period when a certain data-write to the selected one of the memory cells is completed, the write pulse voltage is raised by the second step-up value,
      whereas during a fifth period other than the fourth period in the second period, the write pulse voltage is raised by the first step-up value.

9. A nonvolatile semiconductor memory device comprising:
   a memory cell array having electrically rewritable nonvolatile memory cells arranged therein; and a control unit configured to perform control of repeating a write operation, a write verify operation, and a step-up operation, the write operation being an operation to apply a write pulse voltage to a selected one of the memory cells for data-write and to apply an intermediate voltage having a voltage value smaller than the write pulse voltage to at least an unselected one of the memory cells adjacent to the selected one of the memory cells, the write verify operation being an operation to verify whether data-write is completed or not, and the step-up operation being an operation to raise the write pulse voltage by a certain step-up value if data-write is not completed, the control unit being configured to control the step-up operation such that the write pulse voltage is raised by a first step-up value or a second step-up value, the second step-up value being smaller than the first step-up value, and the control unit being configured to control the step-up operation such that, during a first period when a certain data-write to the selected one of the memory cells is completed, the write pulse voltage is raised by the second step-up value, whereas during a second period other than the first period, the write pulse voltage is raised by the first step-up value.

10. The nonvolatile semiconductor memory device according to claim 9, wherein the control unit is configured to control the step-up operation such that the first step-up value and the second step-up value are fixed at constant values.

11. The nonvolatile semiconductor memory device according to claim 9, wherein the control unit is configured to control the first step-up value and the second step-up value depending on a degradation state of the selected one of the memory cells.

12. The nonvolatile semiconductor memory device according to claim 9, wherein the control unit is configured to change the first period depending on a degradation state of the selected one of the memory cells.

13. A method of operating a nonvolatile semiconductor memory device, the nonvolatile semiconductor memory device comprising a memory cell array having electrically rewritable nonvolatile memory cells arranged therein, the method comprising:

repeating a write operation, a write verify operation, and a step-up operation, by a control unit, the write operation being an operation to apply a write pulse voltage to a selected one of the memory cells for data-write and to apply an intermediate voltage having a voltage value smaller than the write pulse voltage to at least an unselected one of the memory cells adjacent to the selected one of the memory cells, the write verify operation being an operation to verify whether data-write is completed or not, and the step-up operation being an operation to raise the write pulse voltage by a certain step-up value if data-write is not completed;

controlling the step-up operation, by the control unit, such that, in a first period when the number of times of applications of the write pulse voltage is less than a first number, the intermediate voltage is maintained at a constant value, and, in a second period when the number of times of applications of the write pulse voltage is not less than the first number, the intermediate voltage is raised by a certain step-up value; and controlling the step-up operation, by the control unit, such that the first period includes an operation to raise the write pulse voltage by a first step-up value, and the second period includes an operation to raise the write pulse voltage by a second step-up value, the second step-up value being smaller than the first step-up value.

14. The method of operating a nonvolatile semiconductor memory device according to claim 13, wherein the step-up operation is controlled such that the write pulse voltage is raised by the first step-up value over an entirety of the first period, and the write pulse voltage is raised by the second step-up value over an entirety of the second period.

15. The method of operating a nonvolatile semiconductor memory device according to claim 13, wherein the step-up operation is controlled such that the first step-up value is fixed at a constant value over an entirety of the first period, and the second step-up value is fixed at a constant value over an entirety of the second period.

16. The method of operating a nonvolatile semiconductor memory device according to claim 13, wherein the step-up operation is controlled such that, when applying the write pulse voltage for the first time in the second period, a voltage value of the write pulse voltage is not raised.

17. The method of operating a nonvolatile semiconductor memory device according to claim 13, wherein the step-up operation is controlled such that, in a third period when the number of times of applications of the write pulse voltage is not less than a second number, the intermediate voltage is maintained at a constant value, the second number being larger than the first number, and the step-up operation being controlled such that the third period includes an operation to raise the write pulse voltage by the first step-up value.

18. The method of operating a nonvolatile semiconductor memory device according to claim 13, wherein the step-up operation is controlled such that, in a third period when the number of times of applications of the write pulse voltage is not less than a second number, the intermediate voltage is maintained at a constant value, the second number being larger than the first number, and the step-up operation is controlled such that the third period includes an operation to raise the write pulse voltage by a third step-up value, the third step-up value being larger than the first step-up value.

* * * * *